(12) United States Patent
Ohta

(10) Patent No.: US 10,135,441 B2
(45) Date of Patent: Nov. 20, 2018

(54) KEY INPUT APPARATUS

(71) Applicant: TDK Corporation, Tokyo (JP)

(72) Inventor: Naoki Ohta, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 15/823,689

(22) Filed: Nov. 28, 2017

(65) Prior Publication Data

US 2018/0262194 A1    Sep. 13, 2018

(30) Foreign Application Priority Data

Mar. 13, 2017   (JP) .................................. 2017-46900

(51) Int. Cl.
*H03K 17/972* (2006.01)
*H01H 13/705* (2006.01)
*H01H 13/14* (2006.01)

(52) U.S. Cl.
CPC ........... *H03K 17/972* (2013.01); *H01H 13/14* (2013.01); *H01H 13/705* (2013.01)

(58) Field of Classification Search
CPC ..... H01H 13/14; H01H 13/705; H03K 17/972
See application file for complete search history.

(56) References Cited

U.S. PATENT DOCUMENTS 4,211,991 A   7/1980   Lombard et al.

FOREIGN PATENT DOCUMENTS

| JP | 2008-515043 A | 5/2008 |
|----|---------------|--------|
| JP | 2010-257638 A | 11/2010 |
| JP | 2013-131040 A | 7/2013 |

OTHER PUBLICATIONS

Office action dated Jan. 18, 2018 issued in corresponding JP patent application No. 2017-046900 (and English translation thereof).

*Primary Examiner* — Leon Flores
(74) *Attorney, Agent, or Firm* — Posz Law Group, PLC

(57) ABSTRACT

A key input apparatus includes a key top capable of moving up and down through a pressing operation; a first substrate, which includes a first surface, which is positioned on the key top side, and a second surface, which is opposite to the first surface, and the first substrate supports the key top and is provided to be movable up and down along with the key top; a second substrate, which is provided between the key top and the first substrate in the direction of the up-and-down movement of the key top, and the second substrate includes a first surface, which is positioned on the first substrate side, and a second surface, which is opposite to the first surface; a magnetic field generation unit; a magnetic sensor unit, which includes a magnetic detection element that detects a magnetic field generated from the magnetic field generation unit; and an adhesion unit, which includes a soft magnetic material capable of adhering to the magnetic field generation unit. The magnetic sensor unit and the adhesion unit are provided on one of the first surface of the first substrate and the first surface of the second substrate, and the magnetic field generation unit is provided on the other of the first surface of the first substrate and the first surface of the second substrate, opposite to the adhesion unit.

14 Claims, 8 Drawing Sheets

KEY INPUT APPARATUS

CROSS REFERENCE TO RELATED APPLICATION

The present application is based on Japanese Patent Application No. 2017-46900 filed on Mar. 13, 2017, the disclosure of which is incorporated herein by reference.

FIELD OF THE INVENTION

The present invention relates to a key input apparatus that uses a magnetic sensor.

BACKGROUND OF THE INVENTION

A key input apparatus as typified by a keyboard in which a plurality of key tops is arranged is generally used as a device for inputting information such as text, numbers, symbols or the like in various electronic devices, such as mobile phones, portable information terminals such as PDAs, electronic dictionaries and notebook personal computers.

Conventionally, rubber dome keyboards in which rubber domes are provided directly below the key tops, for example, have been used as notebook personal computer keyboards. In a rubber dome keyboard, when the user presses down the key top, the rubber dome positioned directly below the key top is pressed down. Through this, an electrical connection is made in a membrane sheet circuit, and a signal corresponding to the key top pressed down by the user is input into the electronic device such as a notebook personal computer.

In recent years, much development that is focused on reducing the thickness of the keyboards accompanying progress in making electronic devices more compact and thinner. In order to make the above-described rubber dome keyboard thinner, making the thickness of the rubber domes thinner has been considered. However, when the thickness of the rubber domes is reduced, problems arise in that rubber dome buckling properties worsen and the click sensation given to the user declines. Consequently, there are limits to further progress in making rubber dome keyboards thinner.

As a key input apparatus targeting thinness, in the past an input apparatus has been proposed (see Patent Literature 1) that comprises a magnetoresistive effect element and a plurality of magnets provided on a substrate, a support body composed of an elastic material covering the magnetoresistive effect element and the magnets, and a ferromagnetic material embedded in the support body. In this input apparatus, a zero magnetic field region is formed on the substrate by alternating the N-poles and S-pole of the magnets, the magnetoresistive effect element is positioned within the zero magnetic field region on the substrate, and the support body is provided such that the ferromagnetic material is positioned directly over the magnetoresistive effect element. Furthermore, when the ferromagnetic material is displaced by operation of the support body, a change in the distribution of the magnetic field strength on the substrate is caused, and the resistance value of the magnetoresistive effect element changes in accordance with this change in the distribution of the magnetic field strength.

In addition, an input apparatus that uses a magnetism detection element and magnets has been proposed (see Patent Literature 2) that comprises two magnets provided on a substrate with a gap in between the two, an MR element provided on the substrate to be interposed between the two magnets, and a soft magnetic material provided on the MR element to be displaceable. In this input apparatus as well, the strength of the magnetic field emitted from the magnets changes depending on the displacement of the soft magnetic material, and through this the resistance value of the MR element changes.

PRIOR ART

Patent Literature

[PATENT LITERATURE 1] JP Laid-Open Patent Application No. 2013-131040

[PATENT LITERATURE 2] National Patent Publication No. 2008-515043

SUMMARY OF THE INVENTION

Problem to be Solved by the Invention

In the input apparatuses discussed in Patent Literature 1 and 2, the magnetic flux induced from the magnets to the magnetic materials (the ferromagnetic material and the soft magnetic material) is caused to change by changing the distance between the magnets and the magnetic materials, in order to realize change in the resistance value of the magnetic detection elements (magnetoresistive effect elements, the MR element, and so forth). With this kind of input apparatus, change in the resistance value of the magnetic detection element is possible even if the amount of change in the distance between the magnetic materials and the magnets is relatively small, depending on the sensitivity of the magnetic detection element. Consequently, information input is possible even if the key top pressing amount (stroke amount) is smaller than in an input apparatus using a conventional rubber dome, so the input apparatus (keyboard) can be made thinner.

In addition, in an electronic device that uses this kind of input apparatus, a threshold value in accordance with the change in resistance value of the magnetic detection element can be appropriately set, and a signal corresponding to the pressed key top can be output by the input apparatus from this threshold value and output based on the change in resistance value of the magnetic detection element, so it is possible to easily customize the relationship between the input the key top pressing amount (stroke amount) and the input determination, that is the operability of the input apparatus, by the user altering the threshold value setting.

However, in the input apparatus discussed in Patent Literature 1 and 2, the magnetic flux introduced from the magnets to the magnetic detection elements is caused to change by displacing the magnetic materials, but the distance between the magnets and the magnetic detection element is fixed. Consequently, the absolute amount of the change in the resistance value of the magnetic detection element (the magnitude of the resistance value change) is small, and the problem arises that customization that can satisfy the demands on operability that differ depending on the user is difficult.

In order to increase the absolute amount of the change in resistance value of the magnetic detection element, consideration has been given to enabling use of the magnetic field emitted from the magnets to the extent possible by providing a magnetic shield or the like, or making the volume of the magnets relatively large. However, when a magnetic shield or the like is provided or the volume of the magnets is made relatively large, a problem arises that it becomes extremely difficult to achieve further thinning of the key input apparatus.

In consideration of the foregoing, it is an object of the present invention to provide a key input apparatus that can enlarge the absolute amount of change in output based on the change in resistance value of the magnetic detection element and that is capable of having a reduced thickness.

Means for Solving the Problem

To resolve the above-described problems, the present invention provides a key input apparatus comprising: a key top capable of moving up and down through a pressing operation; a first substrate including a first surface, which is positioned on the key top side, and a second surface, which is opposite to the first surface, and the first substrate supports the key top and is movable up and down along with the key top; a second substrate provided between the key top and the first substrate in the direction of the up-and-down movement of the key top, and the second substrate includes a first surface positioned on the first substrate side and a second surface opposite the first surface; a magnetic field generation unit; a magnetic sensor unit, which includes a magnetic detection element that detects a magnetic field generated from the magnetic field generation unit; and an adhesion unit comprising a soft magnetic material, which is capable of adhering to the magnetic field generation unit; wherein the magnetic sensor unit and the adhesion unit are provided on one of the first surface of the first substrate and the first surface of the second substrate, and the magnetic field generation unit is provided on the other of the first surface of the first substrate and the first surface of the second substrate, opposite to the adhesion unit.

The magnetic field generation unit may be provided on the first surface of the first substrate, and the magnetic sensor unit and the adhesion unit on the first surface of the second substrate. Alternatively, the magnetic field generation unit may be provided on the first surface of the second substrate, and the magnetic sensor unit and the adhesion unit may be provided on the first surface of the first substrate.

Preferably, the magnetism sensing direction of the magnetic detection element is a direction roughly orthogonal to the direction of up-and-down movement of the key top, and the magnetic field generation unit is capable of generating a magnetic field in a direction roughly orthogonal to the direction of the up-and-down movement of the key top.

The magnetic field generation unit is preferably capable of generating a magnetic field in a direction roughly orthogonal to the magnetism sensing direction of the magnetic detection element. Two of the magnetic field generation units may be provided facing each other to interpose the magnetic sensor unit in between the two of the magnetic field generation units, in the plan view of the key input apparatus. Each of the two magnetic field generation units is capable of generating a magnetic field in roughly parallel directions to each other, or in roughly antiparallel directions to each other. The magnetic sensor unit may further include a bias magnetic field generation unit capable of impressing on the magnetic detection element a bias magnetic field in a direction roughly orthogonal to the magnetism sensing direction of the magnetic detection element, and the magnetic sensor may be provided at a position offset from a center position of the two magnetic field generation units.

The adhesion unit preferably functions as a yoke that introduces magnetic flux from the magnetic field generation unit to the magnetic detection element, and the substrate on which the magnetic field generation unit is provided, of the first substrate and the second substrate, is preferably made of a nonmagnetic material.

The key top is preferably biased in a direction away from the second substrate. A biasing member may be provided on the second surface side of the first substrate, and the biasing member biases the key top in a direction away from the second substrate. The first substrate may be a biasing member that biases the key top in a direction away from the second substrate.

Preferably, a plurality of the key tops is positioned in an array, and the apparatus includes the magnetic field generation unit, the magnetic detection element, the adhesion unit and the biasing member in correspondence with each of the plurality key tops, and the biasing force of the biasing member that corresponds to each of the plurality of key tops differs in accordance with the position of the key top.

A GMR element or a TMR element can be used as the magnetic detection element.

Effects of the Invention

With the present invention, it is possible to provide a key input apparatus that can enlarge the absolute amount of change in output based on the change in resistance value of the magnetic detection element and that is capable of a reduction in thickness.

DETAILED DESCRIPTION OF THE INVENTION

The preferred embodiments of the present invention will be described with reference to the drawings.

First Embodiment

Figure 1:
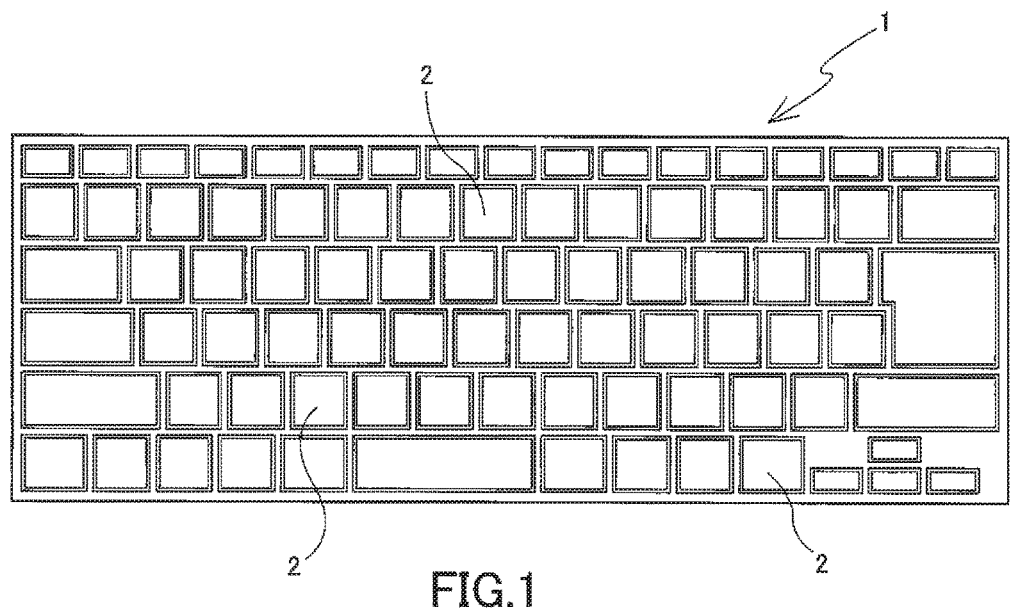
FIG. 1 is a plan view showing a schematic configuration of a keyboard according to a first embodiment of the present invention.
Figure 2:
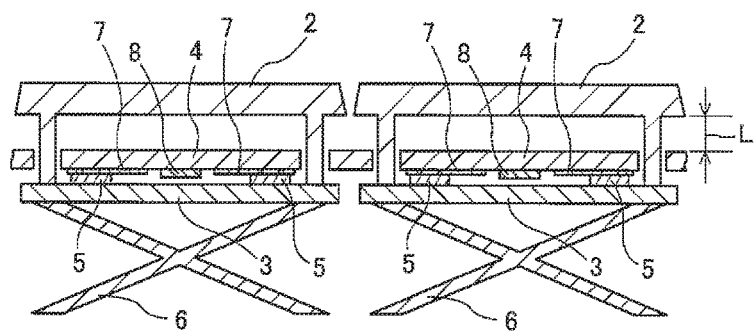
FIG. 2 is a partially enlarged cross-sectional view showing the schematic configuration of the keyboard according to the first embodiment of the present invention.
Figure 3:
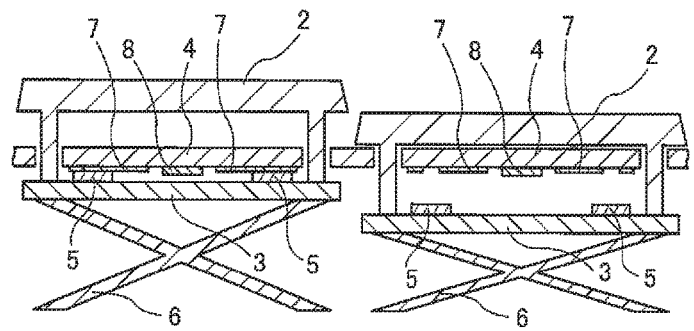
FIG. 3 is a partially enlarged cross-sectional view showing the state in which one of the key tops of the keyboard shown in FIG. 2 has been pressed down.
Figure 4:
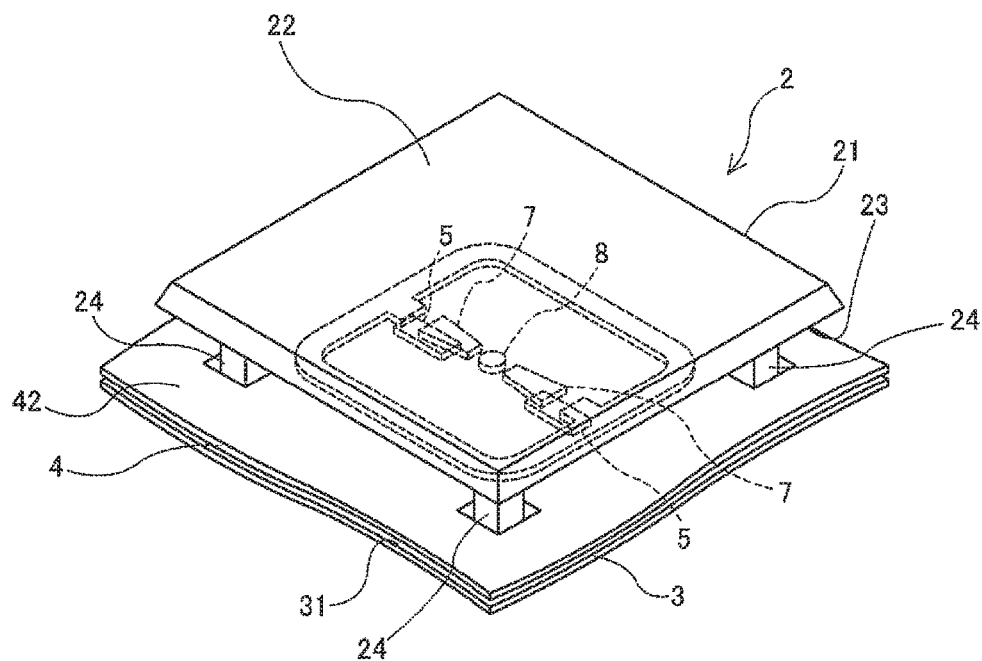
FIG. 4 is a perspective view showing the schematic configuration of a key top in the first embodiment of the present invention.
Figure 5:
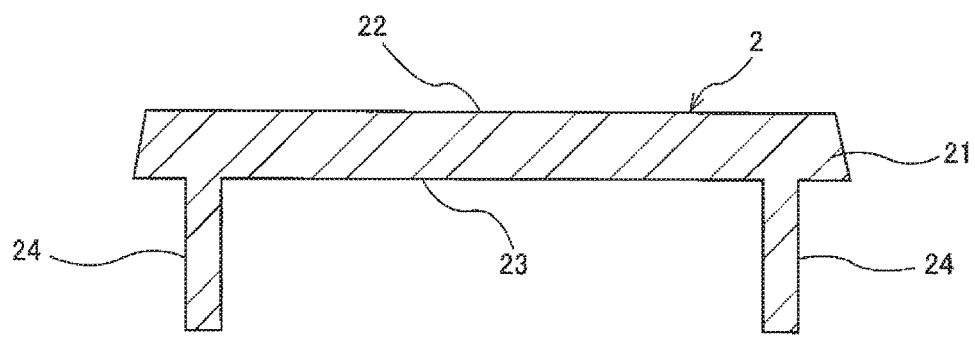
FIG. 5 is a cross-sectional view showing the schematic configuration of the key top according to the first embodiment of the present invention.
Figure 6:
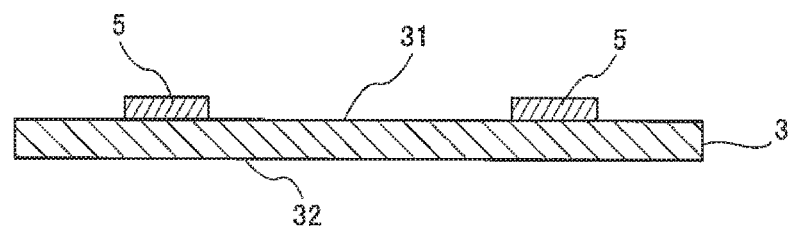
FIG. 6 is a cross-sectional view showing the schematic configuration of the first substrate according to the first embodiment of the present invention.
Figure 7:
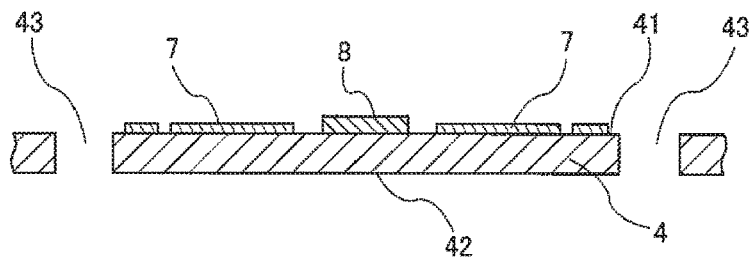
FIG. 7 is a cross-sectional view showing the schematic configuration of the second substrate according to the first embodiment of the present invention.
Figure 8:
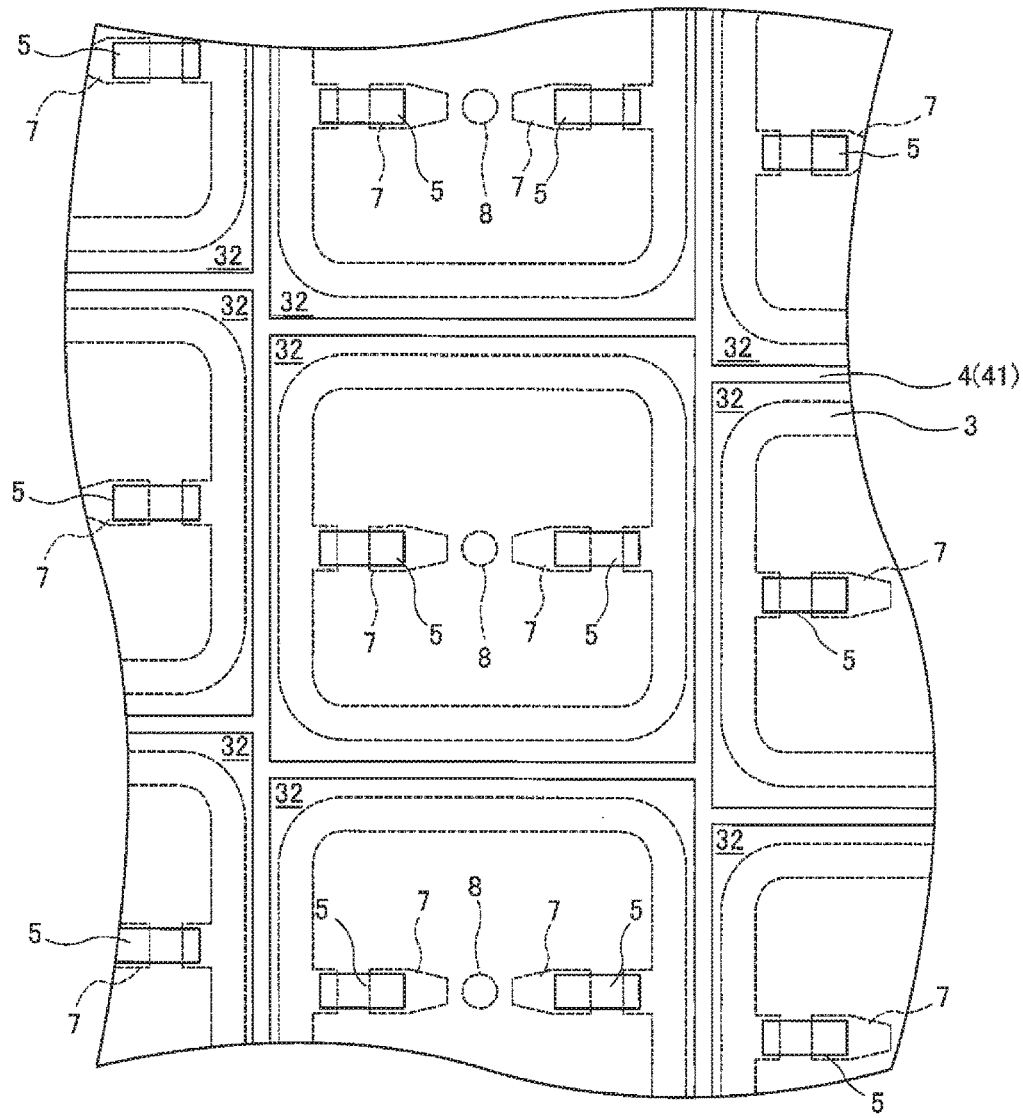
FIG. 8 is a plan view of the keyboard according to the first embodiment of the present invention as seen from the second surface side of the first substrate.
Figure 9:
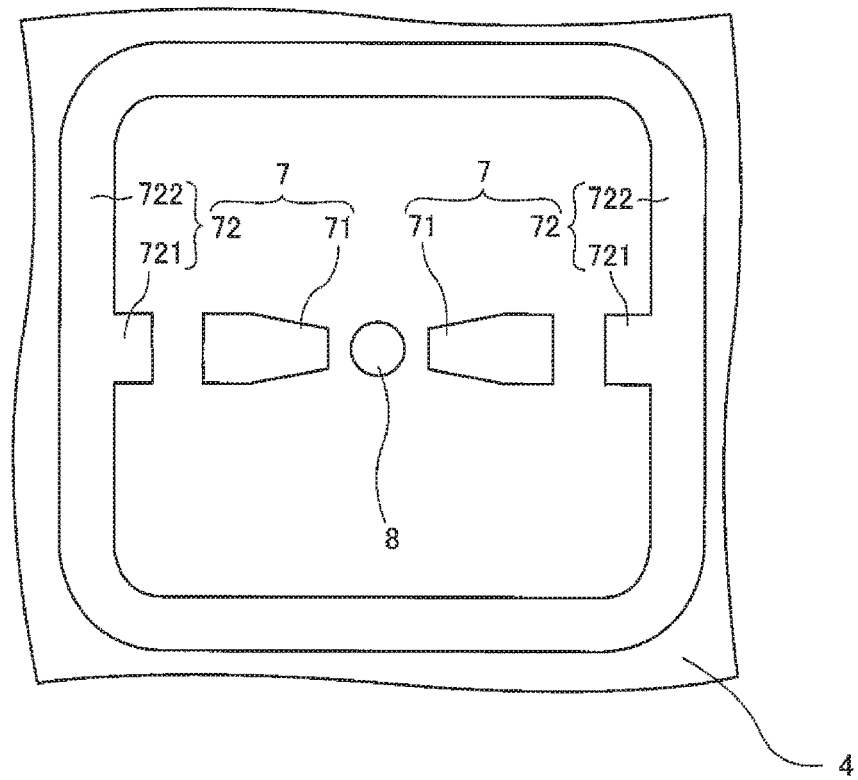
FIG. 9 is a partially enlarged plan view showing the schematic configuration of the magnetic sensor unit and the adhesion unit according to the first embodiment of the present invention.

FIG. 1 is a plan view showing a schematic configuration of a keyboard according to a first embodiment, FIG. 2 is a partially enlarged cross-sectional view showing the schematic configuration of the keyboard according to the first embodiment, FIG. 3 is a partially enlarged cross-sectional view showing the state in which one of the key tops of the keyboard shown in FIG. 2 has been pressed down, FIG. 4 is an perspective view showing the schematic configuration of a key top in the first embodiment, FIG. 5 is a cross-sectional view showing the schematic configuration of the key top according to the first embodiment, FIG. 6 is a cross-sectional view showing the schematic configuration of a first substrate according to the first embodiment, FIG. 7 is a cross-sectional view showing the schematic configuration of a second substrate according to the first embodiment, FIG. 8 is a plan view of the keyboard according to the first embodiment as seen from the second surface side of the first substrate, and FIG. 9 is a partially enlarged plan view showing the schematic configuration of the magnetic sensor unit and the adhesion unit according to the first embodiment.

As shown in FIG. 1~FIG. 9, a keyboard 1 according to the first embodiment is a keyboard for a personal computer and comprises a plurality of key tops 2 arranged in parallel, a first substrate 3 that supports each of the key tops 2, and a second substrate 4 positioned between the key tops 2 and the first substrate 3.

The key top 2 made of resin or the like has a base 21 that includes a pressing surface 22 and four pillars 24, which are provided on an opposing surface 23 opposite the pressing surface 22 of the base 21 (see FIG. 5). The key top 2 is supported on the first substrate 3 via the four pillars 24. When the pressing surface 22 is pressed down, the key top 2 moves in the up-down direction (the up-down direction in FIG. 2 and FIG. 3). The maximum stroke amount of the key top 2 is defined by the length L between the opposing surface 23 of the base 21 of the key top 2 and the second substrate 4. That is, the maximum stroke amount of the key top 2 is determined by the length of the four pillars 24 and the thickness of the second substrate 4.

The first substrate 3 has a first surface 31 positioned on the key top side 2 and a second surface 32 opposite the first surface 31, and two magnets 5 are provided on the first surface 31 with a predetermined spacing as magnetic field generation units (see FIG. 6). The size of the magnets 5 is not particularly limited and for example may be set to around 3~6 mm×1~3 mm. The thickness of the magnets 5 is likewise not particularly limited, and for example may be set to around 0.5~2 mm.

On the second surface 32 of the first substrate 3, a biasing member 6 is provided. The biasing member 6 biases the first substrate 3 toward the key top 2 side (see FIG. 2, FIG. 3). By thus providing the biasing member 6, after the user has caused the key top 2 to move in the downward direction (the direction toward the second substrate 4 side) by pressing down with a finger, it is possible to cause the key top 2 to move in the upward direction and return to the original position by releasing the finger. As the biasing member 6, any member that can bias the first substrate 3 toward the key top 2 side can be used, for example a plate spring, an elastic material such as rubber, or the like.

In the first embodiment, the biasing force of the biasing member 6 provided on the second surface 32 of each first substrate 3 may be mutually the same, or may differ. When the biasing force of each biasing member 6 differs, a biasing member 6 with a relatively small biasing force is preferably provided on the second surface 32 of the first substrate 3, opposite the key tops 2 positioned near the ends of the keyboard 1 in the lengthwise direction (the left-right direction in FIG. 1), for example, and a biasing member 6 with a relatively large biasing force is preferably provided on the second surface 32 of the first substrate 3 opposite the key tops 2 positioned near the center of the keyboard 1. In general, the key tops 2 positioned near the two ends of the keyboard 1 in the lengthwise direction are pressed down by the user's little fingers while key tops 2 positioned near the center of the keyboard 1 are pressed down the user's thumbs and index fingers. The pressing force from the little finger is often smaller than the pressing force from the thumb and index finger. Consequently, by making the biasing force of the biasing members 6 provided opposite to key tops 2 positioned near the two ends of the keyboard 1 in the lengthwise direction relatively small, input with certainty is possible even when the key top 2 is pressed down by a little finger having a relatively small pressing force.

The biasing members 6 may be fixed to the second surface 32 of the first substrate 3, but preferably are attached to be easily removable and exchangeable. By having the biasing members 6 attached to be easily exchangeable, it is possible for the user to switch to biasing members 6 having a biasing force in conformity with the user's desires.

As the first substrate 3, it is possible for example to use a substrate composed of nonmagnetic materials such as resin, phosphor bronze, stainless steel, aluminum or the like. The thickness of the first substrate 3 is not particularly limited and may be any thickness as long as the key top 2 can be supported and the desired durability can be obtained.

The second substrate 4 positioned between the key top 2 and the first substrate 3 includes a first surface 41 positioned on the first substrate 3 side and a second surface 42 opposite the first surface 41 (see FIG. 7). Through-holes 43, into which the four pillars 24 of the key tops 2 are loosely inserted, are formed in the second substrate 4. Two adhesion units 7, which face the two magnets 5 and partially overlap the magnets 5 in the up-down movement direction of the key top 2, and a magnetic sensor unit 8, which is positioned between the two adhesion units 7, are provided on the first surface 41 of the second substrate 4 to be opposite the key tops 2 (see FIG. 8).

Figure 10:
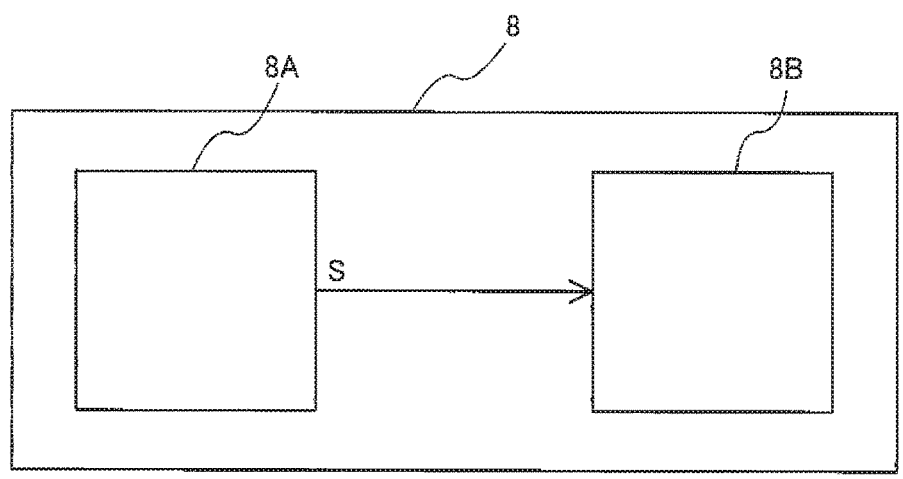
FIG. 10 is a block diagram showing the schematic configuration of the magnetic sensor unit according to the first embodiment of the present invention.

The magnetic sensor unit 8 has a magnetic sensor element unit 8A, which outputs a sensor signal S on the basis of change in the magnetic field formed by the magnet 5, and a detector unit 8B, which outputs an electrical signal on the basis of the sensor signal S (see FIG. 10). The magnetic sensor element unit 8A includes a magnetic detection element. Preferably, the magnetic detection element is one that has a magnetism sensing direction in a direction roughly orthogonal to the direction of up-and-down movement of the key top 2, that is, in the in-plane direction of the second substrate 4, and, for example, a GMR element, a TMR element or the like may be used.

The adhesion unit 7 is formed of a material that can adhere to the magnet 5 through the magnetic force of the magnet 5. Through the adhesion force of this adhesion unit 7, a feeling of resistance, that is, an appropriate click feeling, can be conveyed to the user when the key top 2 is pressed down.

The adhesion unit 7, which is made of a soft magnetic material such as permalloy, electromagnetic steel, permendule or the like, includes first adhesion units 71, the width of which gradually narrows when nearing the magnetic sensor unit 8, and a second adhesion unit 72, which is provided with a predetermined gap to the first adhesion unit 71 (see FIG. 9). The second adhesion unit 72 includes protrusions 721 facing the ends of the first adhesion units 71 (the ends positioned on the side farthest from the magnetic sensor unit 8) and an annular unit 722 that links the two protrusions 721. The adhesion unit 7 is provided such that the end of the first adhesion units 71 and the protrusions 721 of the second adhesion unit 72 are opposite the magnet 5 in the up-and-down direction of the key top 2. Because the first adhesion unit 71 of the adhesion unit 7 made of soft magnetic material has this kind of shape, the adhesion unit 7 can function as a yoke that effectively introduces magnetic flux emitted from the magnet 5 to the magnetic sensor unit 8. By having the adhesion unit 7 function as a yoke in this manner, it is possible to increase the distance between the magnetic sensor unit 8 and the magnet 5. Hence, an effect is achieved that the magnetic sensor unit 8 is unlikely to receive the influence of a leakage of the magnetic field from the magnet 5. In addition, because the adhesion unit 7 (first and second adhesion units 71 and 72) has the above-described shape, when the magnet 5 makes contact with the end of the first adhesion unit 71 or the protrusion 721 of the second adhesion unit 72, the second adhesion unit 72 serves the role of a return yoke and a closed magnetic circuit is formed by the first adhesion unit 71, the magnet 5 and the second adhesion unit 72 Consequently, it is possible to reduce the magnetic effect that the magnetic field formed by the magnet 5 imposes on adjacent keys.

The length between the end of the first adhesion unit 71 (the end facing the magnetic sensor unit 8 in the in-plane direction of the second substrate 4) and the end of the magnetic sensor unit 8 (the end facing the adhesion unit 7 in the in-plane direction of the second substrate 4) is not particularly limited, and for example may be set to around 0~2 mm.

Figure 11:
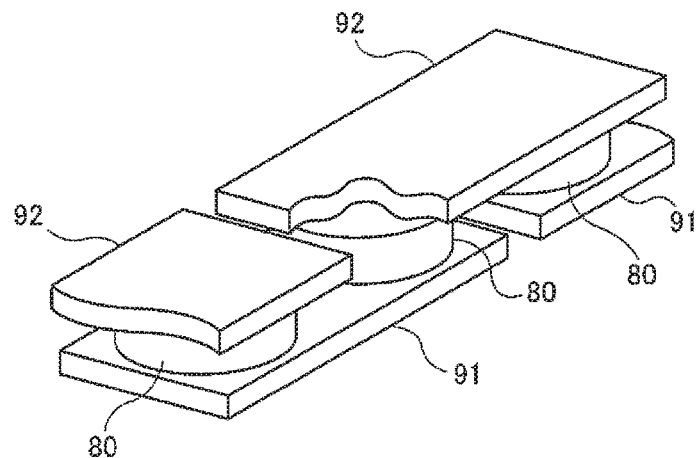
FIG. 11 is a perspective view showing the schematic configuration of the TMR element according to the first embodiment of the present invention.

A TMR element the magnetic sensor element unit 8A possess has a plurality of lower lead electrodes 91, a plurality of TMR laminated bodies 80 and a plurality of upper lead electrodes 92, as shown in FIG. 11. The lower lead electrodes 91 and the upper lead electrodes 92 are made of one type of electrically conductive material out of Cu, Al, Au, Ta, Ti or the like, or a composite film of two or more electrically conductive materials. The thickness is around 0.3~2.0 µm each.

The plurality of lower lead electrodes 91 is provided on a substrate (undepicted). Each of the plurality of lower lead electrodes 91 has a long, slender, roughly rectangular shape and is provided such that there is a predetermined gap between two adjacent lower lead electrodes 91 in an electrical series direction of the plurality of TMR laminated bodies 80 arranged in an array. The TMR laminated bodies 80 are provided near each of the two ends of the lower lead electrodes 91 in the lengthwise direction. That is, two TMR laminated bodies 80 are provided on each of the plurality of lower lead electrodes 91.

Figure 12:
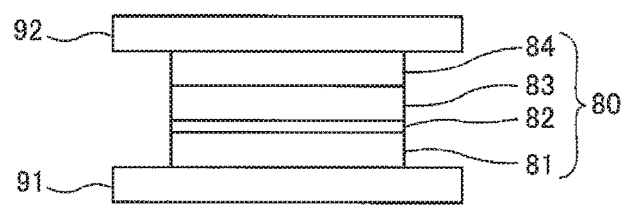
FIG. 12 is a cross-sectional view showing the schematic configuration of the TMR element according to the first embodiment of the present invention.

As shown in FIG. 12, the TMR laminated bodies 80 in the first embodiment each have a magnetization pinned layer 83 in which the magnetization direction is fixed, a free layer 81 in which the magnetization direction changes in accordance with the direction of an impressed magnetic field, a nonmagnetic layer 82, which is positioned between the magnetization pinned layer 83 and the free layer 81, and an antiferromagnetic layer 84.

The TMR laminated body 80 has a structure in which the free layer 81, the nonmagnetic layer 82, the magnetization pinned layer 83 and the antiferromagnetic layer 84 are layered in that order from the lower lead electrode 91 side. The free layer 81 is electrically connected to the lower lead electrode 91, and the antiferromagnetic layer 84 is electrically connected to the upper lead electrode 92. The following can be cited as materials composing the free layer 81 and the magnetization pinned layer 83: NiFe, CoFe, CoFeB, CoFeNi, Co2MnSi, Co2MnGe, FeOX (oxides of Fe), or the like. The thicknesses of the free layer 81 and the magnetization pinned layer 83 are around 1~10 nm each.

The nonmagnetic layer 82 is a tunnel barrier layer and is a film vital for causing the tunnel magnetoresistance effect (TMR effect) to be realized in the TMR laminated body 80. The following can be cited as examples of materials composing the nonmagnetic layer 82: Cu, Au, Ag, Zn, Ga, TiOX, ZnO, InO, SnO, GaN, ITO (Indium Tin Oxide) Al2O3, MgO or the like. The nonmagnetic layer 82 may also be composed of a laminated film of two or more layers. For example, the nonmagnetic layer 82 can be composed of a three-layer laminated film of Cu/ZnO/Cu, or a three-layer laminated film of Cu/ZnO/Zn with one of the Cu replaced with a Zn. The thickness of the nonmagnetic layer 82 is around 0.1~5 nm.

The antiferromagnetic layer 84 is composed of an antiferromagnetic material containing Mn and at least one type of element selected from among a group including Pt, Ru, Rh, Pd, Ni, Cu, Ir, Cr and Fe, for example. The Mn content of this antiferromagnetic material is for example around 35~95 atom %. The antiferromagnetic layer 84 composed of the antiferromagnetic material is exchange coupled with the magnetization pinned layer 83, and serves the role of fixing the direction of magnetization of the magnetization pinned d layer 83.

The plurality of upper lead electrodes 92 is provided on the plurality of TMR laminated bodies 80. Each of the upper lead electrodes 92 has a long, slender, roughly rectangular shape. The upper lead electrodes 92 are provided to have a predetermined gap between two adjacent upper lead electrodes 92 in the electrical series direction of the plurality of TMR laminated bodies 80 arranged in an array and so that the plurality of TMR laminated bodies 80 is connected in series, with the antiferromagnetic layers 84 of two adjacent TMR laminated bodies 80 electrically connected to each other. The TMR laminated bodies 80 may have a composition in which the antiferromagnetic layer 84, the magnetization pinned layer 83, the non-magnetic layer 82 and the free layer 81 are laminated in that order from the lower lead electrode 91. In addition, a cap layer (protective layer) may be provided between the free layer 81 and the lower lead electrode 91 or the upper lead electrode 92.

In the TMR laminated bodies 80, the resistance value changes in accordance with the angle formed between the direction of magnetization of the free layer 81 and the magnetization direction of the magnetization pinned layer 83, with the resistance value becoming a minimum when this angle is 0° (when the magnetization directions are mutually parallel), and the resistance value becoming a maximum when this angle is 180° (when the magnetization directions are mutually antiparallel).

Figure 13:
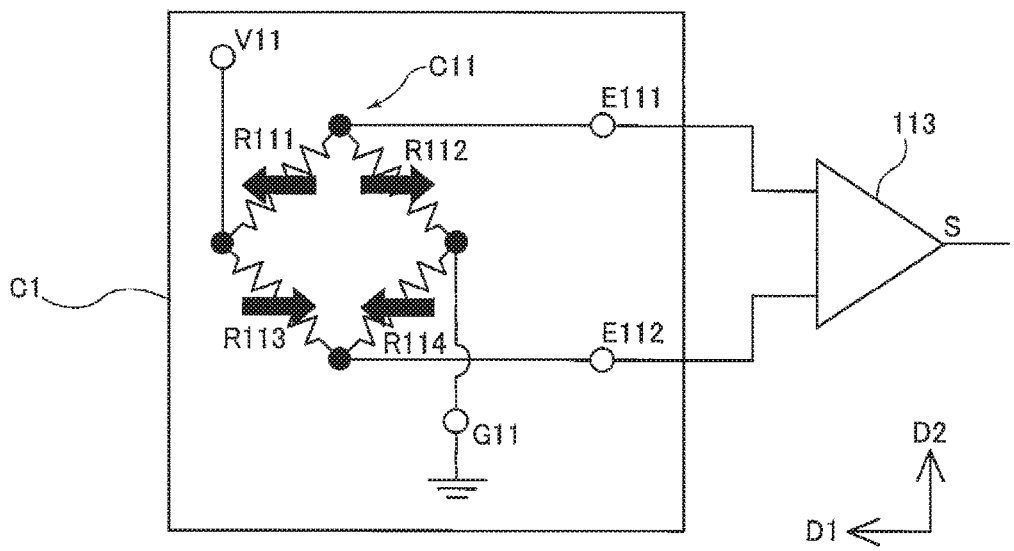
FIG. 13 is a circuit diagram schematically showing the configuration of the magnetic sensor element circuit of the magnetic sensor unit according to the first embodiment of the present invention.

As shown in FIG. 10 and FIG. 13, the magnetic sensor 8A has a magnetic sensor element circuit C1 that outputs the sensor signal S, and the detector 8B outputs an electrical signal on the basis of the sensor signal S output from the magnetic sensor element circuit C1.

The magnetic sensor element circuit C1 includes at least one TMR element, and may include a pair of TMR elements connected in series. In this case, the magnetic sensor element circuit C1 has a Wheatstone bridge circuit including a pair of TMR elements connected in series.

As shown in FIG. 13, a Wheatstone bridge circuit C11 possessed by the magnetic sensor element circuit C1 includes a power source port V11, a ground port G11, two output ports E111 and E112, a first pair of TMR elements R111 and R112 connected in series and a second pair of TMR elements R113 and R114 connected in series. One end of each of the TMR elements R111 and R113 is connected to the power source port V11. The other end of the TMR element R111 is connected to one end of the TMR element R112 and the output port E111. The other end of the TMR element R113 is connected to one end of the TMR element R114 and the output port E112. The other end of each of the TMR elements R112 and R114 is connected to the ground port G11. A power source voltage of a predetermined size is impressed on the power source port V11, and the ground port G11 is connected to ground. In the first embodiment, the above-described TMR element (see FIG. 11 and FIG. 12) is used for all of the TMR elements R111~R114 contained in the Wheatstone bridge circuit C11.

In FIG. 13, the magnetization directions of the magnetization pinned layers 83 of the TMR elements R111~R114 are indicated by the filled-in arrows. In the magnetic sensor element circuit C1, the magnetization directions of the magnetization pinned layers 83 of the TMR elements R111~R114 are parallel to a first direction D1. The magnetization direction of the magnetization pinned layers 83 of the TMR elements R111 and R114, and the magnetization direction of the magnetization pinned layers 83 of the TMR elements R112 and R113, are antiparallel to each other.

In the magnetic sensor element circuit C1 of the magnetic sensor element unit 8A, the electric potential difference of the output ports E111 and E112 changes in accordance with changes in the magnetic field emitted from the magnet, and the sensor signal S corresponding to the electric potential difference of the output ports E111 and E112 is output to the detector unit 8B by a difference detector 113. In the detector unit 8B, the electrical signal is output when it is determined that the sensor signal S exceeds a predetermined threshold value.

In the keyboard 1, which has the above-described composition, the first substrate 3 is pushed up to the key top 2 side by the biasing member 6 provided on the second surface 32, and the magnet 5 provided on the first surface 31 of the first substrate 3 is adhered to the adhesion unit 7 provided on the first surface 41 of the second substrate 4. In this state, maximum magnetic flux is introduced to the magnetic sensor unit 8 via the adhesion unit 7, which functions as a yoke.

When the pressing surface 22 of the key top 2 is pressed by the user from this state, the key top 2 is pressed down and, in conjunction with this, the first substrate 3 is pressed down. Because the magnet 5 is adhered to the adhesion unit 7 prior to the pressing of the pressing surface 22 of the key top 2, when the key top 2 is pressed down by pressing on the pressing surface 22 of the key top 2, a predetermined sense of resistance is given to the user through the biasing force of the biasing member 6 and the adhesion force from the adhesion unit 7. That is, a predetermined click sensation can be given to the user.

When the first substrate 3 is pressed down in conjunction with the pressing down of the key top 2, the magnet 5 provided on the first surface 31 of the first substrate 3 also moves in the downward direction along with the first substrate 3. Through this, the distance between the magnet 5 and the magnetic sensor unit 8 becomes larger. As a result, the magnetic flux introduced to the magnetic sensor unit 8 changes and the resistance value of the magnetic detection element changes.

As is clear from the below-described examples, by causing the distance between the magnet 5 and the magnetic sensor unit 8 to change as in the keyboard 1 according to the first embodiment, it is possible to increase the amount of change in the resistance value of the magnetic detection element in comparison to when the distance between the magnetic sensor unit 8 and the adhesion unit 7, which is composed of soft magnetic materials, is caused to change. Consequently, it is possible to make the volume of the magnet 5 smaller, so that it is possible to easily reduce the thickness of the keyboard 1.

In this manner, with the keyboard 1 according to the first embodiment, it is possible to increase the absolute amount of output change from the magnetic sensor element unit 8A on the basis of the change in resistance value of the magnetic detection element, so it is possible to make the keyboard 1 thinner.

In addition, with the keyboard 1 according to the first embodiment, it is possible to increase the breadth of customization by the user by increasing the amount of change in the resistance value of the magnetic detection element, so it is possible to design the keyboard 1 having operability in accordance with the user's desires.

Second Embodiment

Figure 14:
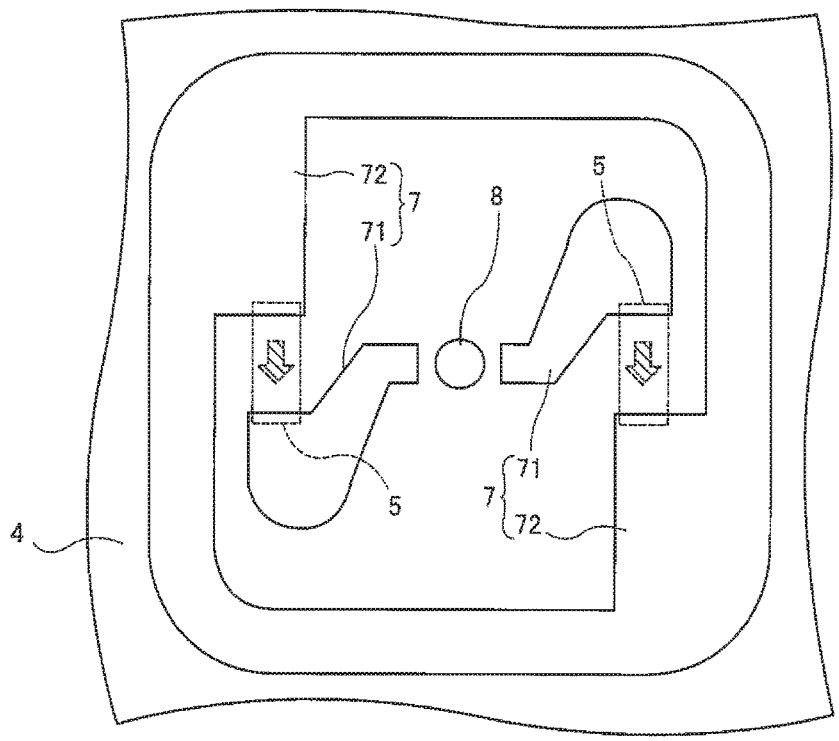
FIG. 14 is a partially enlarged plan view showing the schematic configuration of the magnetic sensor unit, the magnet and the adhesion unit according to a second embodiment of the present invention.
Figure 15:
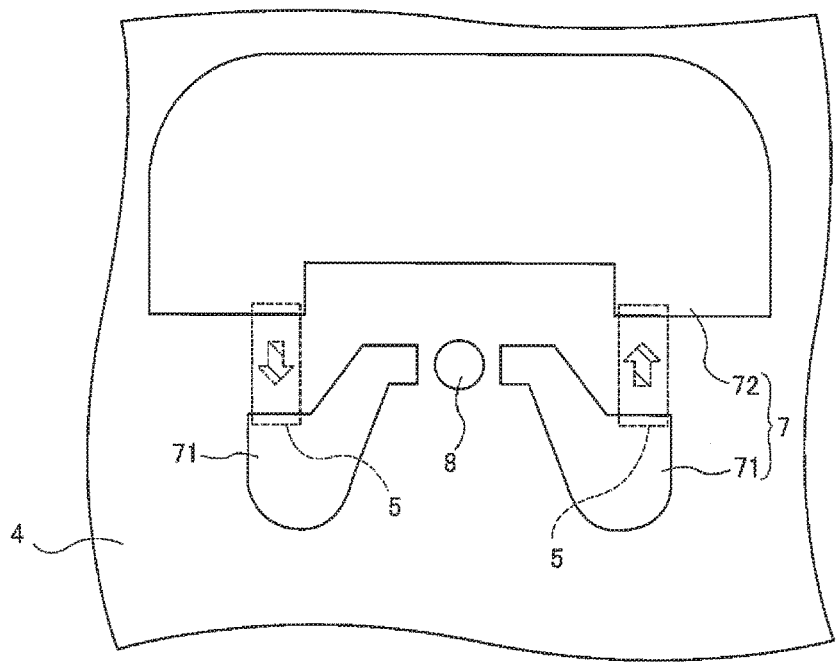
FIG. 15 is a partially enlarged plan view showing the schematic configuration of another state of the magnetic sensor unit, the magnet and the adhesion unit according to a second embodiment of the present invention.

A keyboard according to a second embodiment will be described. FIG. 14 is a partially enlarged plan view showing the schematic configuration of the magnetic sensor unit, the magnet and the adhesion unit according to the second embodiment, and FIG. 15 is a partially enlarged plan view showing the schematic configuration of another state of the magnetic sensor unit, the magnet and the adhesion unit according to the second embodiment. In the keyboard 1 according to the second embodiment, components that are the same in the keyboard according to the first embodiment are labeled with the same symbols and detailed description of such is omitted.

The keyboard 1 according to the second embodiment has roughly the same composition as the keyboard 1 according to the first embodiment with the exception of the composition of the magnet 5 and the adhesion unit 7. Accordingly, the description will center on the composition of the magnet 5 and the adhesion unit 7.

As shown in FIG. 14 and FIG. 15, in the second embodiment, the magnets 5 provided on the first substrate 3 are provided such that the magnetic sensor unit 8 is located in between the magnets 5 in the plan view and are provided such that the N pole and the S pole of the magnets 5 are oriented in a direction (the vertical direction in FIG. 14 and FIG. 15) orthogonal to the arrangement direction of the magnetic sensor unit 8 and the two magnets 5 (the lateral direction in FIG. 14 and FIG. 15). The magnetization direction of the two magnets 5 (the direction of the arrows shown on the magnets 5 in FIG. 14 and FIG. 15) is a direction orthogonal to the above-described arrangement direction and as is clear from the below-described examples, in a state in which the magnets 5 are in contact with the adhesion units 7 (an adhered state, a state in which the magnets 5 and the magnetic sensor unit 8 are closest together) and a state in which the magnets 5 are separated from the adhesion units 7 (the magnetic sensor unit 8), it is possible to change the direction of the magnetic flux introduced to the magnetic sensor unit 8. For example, in a state in which the magnets 5 are in contact with the adhesion units 7, magnetic flux is introduced to the magnetic sensor unit 8 from the ends of the first adhesion unit 71 (the ends opposite the magnetic sensor unit 8), so the direction of the magnetic flux is the parallel direction to the magnetic sensor unit 8 and the two magnets 5 (the lateral direction in FIG. 14 and FIG. 15). On the other hand, in a state in which the magnets 5 are separated from the adhesion units 7, the direction of the magnetic flux introduced to the magnetic sensor unit 8 is the direction orthogonal to the above-described parallel direction (the vertical direction in FIG. 14 and FIG. 15). Thus, in the second embodiment, in the two states, namely the state in which the magnets 5 are in contact with the adhesion units 7 and the state in which the magnets 5 are separated from the adhesion units 7, that is in the two states namely the state in which the key top 2 is not pressed down and the state in which the key top 2 has been pressed down, it is possible to cause the direction of the magnetic flux introduced to the magnetic sensor unit 8 to change, so it is possible to increase input sensitivity in the keyboard 1. Hence, it is possible to increase the customizable breadth relating to the operability of the keyboard 1, and it is possible to satisfy various needs relating to the operability of the keyboard 1 that differ depending on the user.

The orientation of the N pole and S pole of the two magnets 5 (the magnetization direction of the magnets 5) may be roughly parallel to each other (see FIG. 14) or may be roughly antiparallel (see FIG. 15), but as is clear from the below-described examples, by making the magnetization direction of the two magnets 5 roughly antiparallel, it is possible to further increase the amount of change in the resistance value of the magnetic detection element.

In the states shown in FIG. 14 and FIG. 15, the magnetic sensor unit 8 is provided in a central position between the two magnets 5 in the above-described parallel direction (the lateral direction in FIG. 14 and FIG. 15). In the state shown in FIG. 15, when the magnetic sensor unit 8 is provided in a central position between the two magnets 5, when the first substrate 3 is pressed down, in conjunction with the pressing down of the key top 2, and the magnets 5 provided on the first surface 31 of the first substrate 3 move in a downward direction along with the first substrate 3 (when the magnets 5 and the magnetic sensor unit 8 are separated), the vicinity of the magnetic sensor unit 8 achieves a state with an effectively zero magnetic field. When this occurs, the magnetization direction of the free layer 81 in the magnetic detection element (the TMR element, for example) included in the magnetic sensor element unit 8A is not fixed, so it is possible that an erroneous signal could be output from the magnetic sensor element unit 8A.

To ensure that this kind of problem does not arise, in the state shown in FIG. 15, the magnetic sensor unit 8 may further have a biasing magnetic field generation unit (undepicted) such as a hard magnet or the like, capable of impressing a biasing magnetic field in a direction orthogonal to the above-described parallel direction on the magnetic detection element included in the magnetic sensor element unit 8A. Because the magnetic sensor unit 8 has a biasing magnetic field generation unit, even when the magnets 5 and the magnetic sensor unit 8 are separated, and the vicinity of the magnetic sensor unit 8 achieves a state with an effectively zero magnetic field, the magnetization direction of the free layer 81 of the magnetic detection element (the TMR element, for example) is oriented in the direction of the biasing magnetic field, by the biasing magnetic field being impressed from the biasing magnetic field generation unit, so it is possible to prevent erroneous signals being output from the magnetic sensor element unit 8A.

Figure 16A:
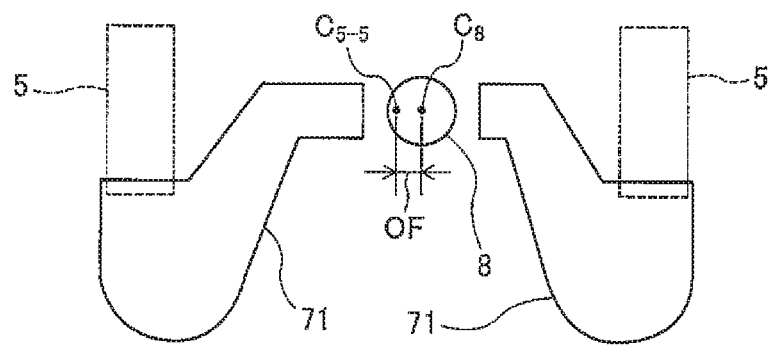
FIG. 16A and FIG. 16B are partially enlarged plan views schematically showing the suitable position of the magnetic sensor unit in the state shown in FIG. 15.
Figure 16B:
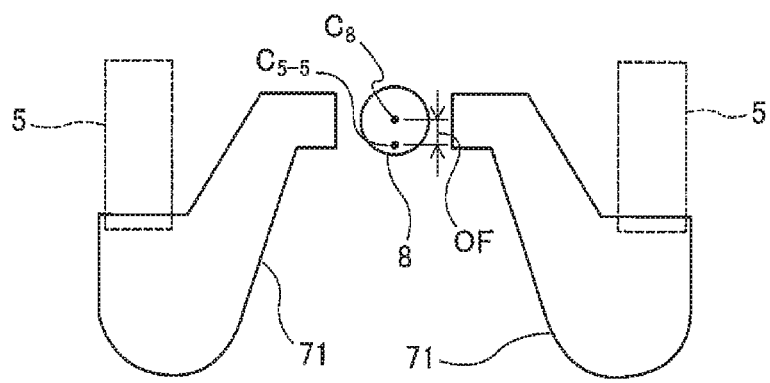

In addition, as shown in FIG. 16A and FIG. 16B, the magnetic sensor unit 8 may be provided at a position C8 offset in the above-described parallel direction or a direction orthogonal thereto from a central position C5-5 (the central position in the above-described parallel direction) between the two magnets 5. Even when the magnets 5 and the magnetic sensor unit 8 are separated, the vicinity of the magnetic sensor unit 8 does not achieve a state with zero magnetic field, so the magnetization direction of the free layer 81 of the magnetic detection element (the TMR element, for example) included in the magnetic sensor element unit 8A is oriented in a fixed direction. Hence, it is possible to prevent erroneous signals from being output from the magnetic sensor element unit 8A. The offset amount OF of the magnetic sensor unit 8 can be appropriately set in consideration of the magnetic field strength at the offset position C8, the direction of the magnetic flux, and so forth.

In the keyboard 1 according to the second embodiment, by having the N pole and the S pole of the magnets 5 oriented in a direction (the vertical direction in FIG. 14 and FIG. 15) orthogonal to the parallel direction (the lateral direction in FIG. 14 and FIG. 15) of the magnetic sensor unit 8 and the two magnets 5, as is clear from the below-described examples, it is possible to further increase the amount of change in the resistance value of the magnetic detection element and in addition it is possible to cause the direction of the magnetic flux near the magnetic sensor unit 8 to change when the magnets 5 and the adhesion units 7 are in contact and when such are separated. Hence, with the keyboard 1 according to the second embodiment, it is possible to further increase the absolute amount of change in output from the magnetic sensor element unit 8A on the basis of the change in the resistance value of the magnetic sensor element and it is possible to increase input sensitivity, and hence it is possible to make the keyboard 1 thinner.

The above-described embodiments were described in order to facilitate understanding of the present invention and are intended to be illustrative and not limiting. Accordingly, each element disclosed in the above-described embodiments should be construed to include all design changes and equivalents falling within the technical scope of the present invention.

Figure 17:
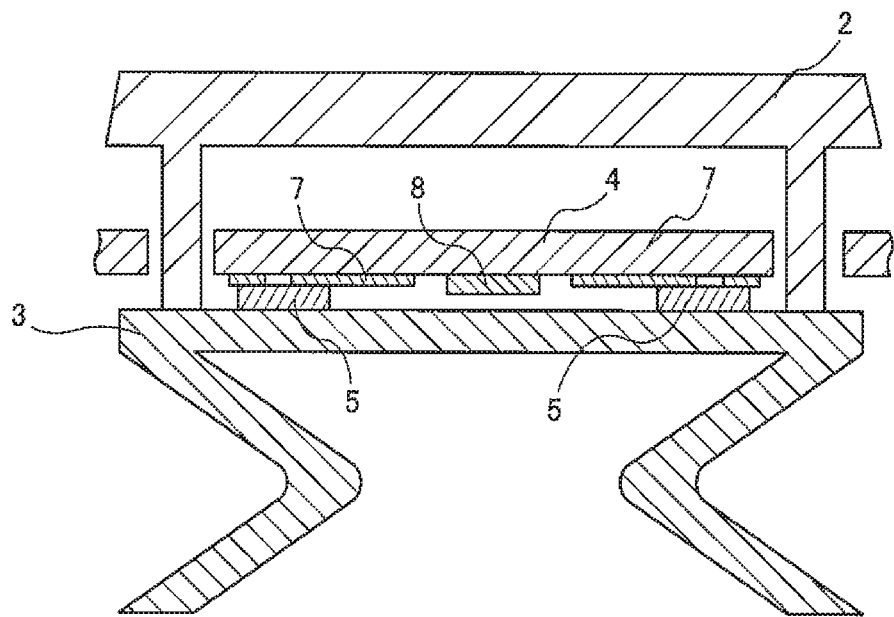
FIG. 17 is a partially enlarged cross-sectional view showing the schematic configuration of another state of the keyboard according to the first and second embodiments of the present invention.

In the above-described first and second embodiments, an example was described in which the biasing member 6 is provided on the second surface 32 of the first substrate 3, but this is intended to be illustrative and not limiting, for the first substrate 3 may also have a biasing function. For example, as shown in FIG. 17, the first substrate 3 may have a spring structure on the second surface 32 side and may comprise a plate spring that biases toward the key top 2 side. With this kind of configuration, it is possible to reduce the number of parts comprising the keyboard 1.

In the above-described first and second embodiments, an example was described in which the magnets 5 are provided on the first surface 31 of the first substrate 3 and the adhesion units 7 and the magnetic sensor unit 8 are provided on the first surface 41 of the second substrate 4, but this is intended to be illustrative and not limiting. For example, it would be fine for the adhesion units 7 and the magnetic sensor unit 8 to be provided on the first surface 31 of the first substrate 3 and for the magnets 5 to be provided on the first surface 41 of the second substrate 4, so that the adhesion units 7 and the magnetic sensor unit 8 move up and down along with the first substrate 3 in conjunction with the up-and-down movement of the key top 2.

In the above-described first and second embodiments, an example was described in which the keyboard 1 was taken as a key input apparatus, but this is intended to be illustrative and not limiting. In addition, the above-described key input apparatus can also be used as a switch apparatus that has two or more stages of threshold values and that outputs signals that differ in accordance with the amount of pressing of the key top 2. For example, the above-described key input apparatus may be applied to the shutter of a digital camera or the like.

EXAMPLES

Below, the present invention is described in greater detail by citing examples, but the present invention is not limited in any way by the below-described examples.

Example 1

Figure 18:
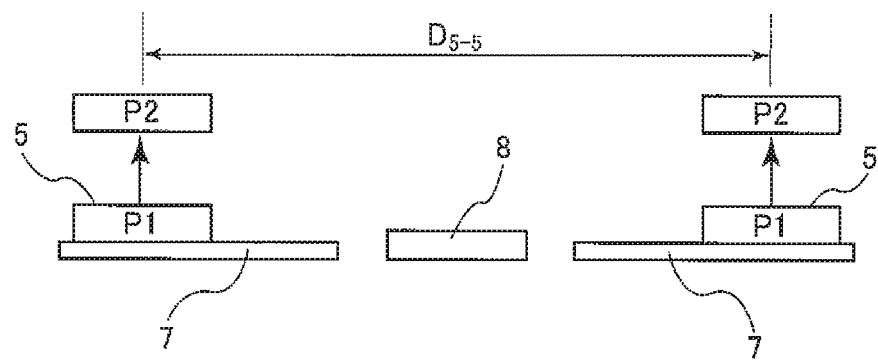
FIG. 18 is a side view schematically showing a model used in simulations in the first through third embodiments.

In the state in which the magnets 5, the magnetic sensor unit 8 and the adhesion units 7 are arranged as shown in FIG. 8, the magnetic flux density (T) and the magnetic flux direction at the magnetic sensor unit 8 when the magnets 5 were respectively positioned at a first position P1 (a position at which the magnets 5 and the adhesion units 7 are in contact) and a second position P2 (a position at which the magnetic flux from the magnets 5 is not introduced to the adhesion units 7), as shown in FIG. 18, were found through simulations. In the simulations, the material comprising the adhesion units 7 was taken to be permalloy, the magnets 5 were taken to be neodymium magnets, the length between the two magnets 5 in the side view shown in FIG. 18 (the left-right direction in FIG. 18 (the length in the lateral direction) D5-5 was taken to be 1 mm and the size of the magnets 5 was taken to be 6.6 mm×2 mm×0.5 mm. The results are shown in Table 1.

Example 2

Other than changing the positions of the magnets 5, the magnetic sensor unit 8 and the adhesion units 7 to the state shown in FIG. 14, the magnetic flux density (T) and the magnetic flux direction at the magnetic sensor unit 8 when the magnets 5 were respectively positioned at the first position P1 and the second position P2 were found through simulations the same as in Example 1. The results are shown in Table 1.

Example 3

Other than changing the positions of the magnets 5, the magnetic sensor unit 8 and the adhesion units 7 to the state shown in FIG. 15, the magnetic flux density (T) and the magnetic flux direction at the magnetic sensor unit 8 when the magnets 5 were respectively positioned at the first position P1 and the second position P2 were found through simulations the same as in Example 1. The results are shown in Table 1.

Comparison Example 1

The positions of the magnets 5 and the adhesion units 7 in the state shown in FIG. 18 were switched, the two adhesion units 7 were linked above the magnetic sensor unit 8 to form one adhesion unit 7, and the magnetic flux density (T) and the magnetic flux direction at the magnetic sensor unit 8 when the adhesion units 7 were respectively positioned at the first position P1 and the second position P2 were found through simulations the same as in Example 1. The results are shown in Table 1.

TABLE 1

|  | Magnetic flux density (T) | | Magnetic flux density change | Magnetic flux direction | |
| --- | --- | --- | --- | --- | --- |
|  | P1 | P2 | rate (%) | P1 | P2 |
| Example 1 | 0.75 | 0.15 | 500 | Parallel direction | Parallel direction |
| Example 2 | 0.5 | 0.14 | 357 | Parallel direction | Orthogonal to parallel direction |
| Example 3 | 0.5 | 0.01 | 5000 | Parallel direction | No direction |
| Comparison example 1 | 0.75 | 0.25 | 300 | Parallel direction | Parallel direction |

As shown in Table 1, in Examples 1~3, it was confirmed that the absolute amount of change in the resistance value of the magnetic detection element could be increased compared to Comparison Example 1. In addition, when Example 1, Example 2 and Example 3 are compared, by having the magnetization direction of the magnets 5 being orthogonal to the parallel direction of the magnetic sensor unit 8 and the two magnets 5 (Examples 2, 3), it was confirmed that the direction of magnetic flux near the magnetic sensor unit 8 could be changed when the magnets 5 and the adhesion units 7 are in contact and when such are separated. In particular, by having the magnetization directions of the magnets 5 be antiparallel (Example 3), it was confirmed that the absolute amount of change in the resistance value of the magnetic detection element could be increased.

When the magnetization directions of the two magnets 5 are antiparallel (Example 3), the vicinity of the magnetic sensor unit 8 achieves a state with effectively zero magnetic field when the magnets 5 and the adhesion units 7 are separated, and the direction of magnetic flux becomes non-directional, but by having the magnetic sensor unit 8 provided with a biasing magnetic field generation unit such as a hard magnet or the like, or by having the magnetic sensor unit 8 positioned offset from the center position between the two magnets 5, it is possible to eliminate the state of zero magnetic field near the magnetic sensor unit 8 when the magnets 5 and the adhesion units 7 are separated.

Accordingly, by having the magnetization direction of the two magnets 5 be antiparallel as in Example 3, it is possible to increase the rate of change of the magnetic flux density introduced to the magnetic sensor unit 8 when the magnets 5 and the adhesion units 7 are in contact or separated, and it is possible to cause the direction of the magnetic flux to change, and consequently, it is possible to greatly improve input sensitivity in the keyboard 1. Hence, it is possible to increase the customizable breadth pertaining to operability of the keyboard 1, so that the various needs relating to operability of the keyboard 1 that differ depending on the user can be satisfied.

DESCRIPTION OF REFERENCE SYMBOLS

1 Keyboard (key input apparatus)
2 Key top
3 First substrate
31 First surface
32 Second surface
4 Second substrate
41 First surface
42 Second surface
5 Magnet (magnetic field generation unit)
6 Biasing member
7 Adhesion unit
8 Magnetic sensor unit

The invention claimed is:

1. A key input apparatus comprising: a key top capable of moving up and down through a pressing operation; a first substrate including a first surface, which is positioned on the key top side, and a second surface, which is opposite to the first surface, wherein the first substrate supports the key top and is movable up and down along with the key top; a second substrate provided between the key top and the first substrate in the direction of the up-and-down movement of the key top, wherein the second substrate Includes a first surface positioned on the first substrate side and a second surface opposite the first surface; a magnetic field generation unit; a magnetic sensor unit, which includes a magnetic detection element that detects a magnetic field generated from the magnetic field generation unit; and an adhesion unit comprising a soft magnetic material capable of adhering to the magnetic field generation unit; wherein the magnetic sensor unit and the adhesion unit are provided on one of the first surface of the first substrate and the first surface of the second substrate, and the magnetic field generation unit is provided on the other of the first surface of the first substrate and the first surface of the second substrate, opposite to the adhesion unit, the magnetism sensing direction of the magnetic detection element is a direction roughly orthogonal to the direction of the up-and-down movement of the key top; and the magnetic field generation unit is capable of generating a magnetic field in a direction roughly orthogonal to the direction of the up-and-down movement of the key too and the magnetism sensing direction of the magnetic detection element.

2. The key input apparatus according to claim 1, wherein: the magnetic field generation unit is provided on the first surface of the first substrate; and the magnetic sensor unit and the adhesion unit are provided on the first surface of the second substrate.

3. The key input apparatus according to claim 1, wherein: the magnetic field generation unit is provided on the first surface of the second substrate; and the magnetic sensor unit and the adhesion unit are provided on the first surface of the first substrate.

4. The key input apparatus according to claim 1, wherein: two of the magnetic field generation units are provided facing each other to interpose the magnetic sensor unit in between the two of the magnetic field generation units, in the plan view of the key input apparatus; and each of the two magnetic field generation units is capable of generating a magnetic field in roughly parallel directions to each other.

5. The key input apparatus according to claim 1, wherein: two of the magnetic field generation units are provided facing each other to interpose the magnetic sensor unit in between the two of the magnetic field generation units, in the plan view of the key input apparatus; and each of the two magnetic field generation units is capable of generating a magnetic field in roughly antiparallel directions to each other.

6. The key input apparatus according to claim 5, wherein the magnetic sensor unit further includes a bias magnetic field generation unit capable of impressing on the magnetic detection element a bias magnetic field in a direction roughly orthogonal to the magnetism sensing direction of the magnetic detection element.

7. The key input apparatus according to claim 5, wherein the magnetic sensor unit is provided at a position offset from a center position of the two magnetic field generation units.

8. The key input apparatus according to claim 1, wherein the adhesion unit functions as a yoke that introduces magnetic flux from the magnetic field generation unit to the magnetic detection element.

9. The key input apparatus according to claim 1, wherein the substrate on which the magnetic field generation unit is provided, of the first substrate and the second substrate, is made of a nonmagnetic material.

10. The key input apparatus according to claim 1, wherein the key top is biased in a direction away from the second substrate.

11. The key input apparatus according to claim 10, wherein a biasing member is provided on the second surface side of the first substrate, wherein the biasing member biases the key top in a direction away from the second substrate.

12. The key input apparatus according to claim 11, wherein:
    a plurality of the key tops is positioned in an array;
    the apparatus includes the magnetic field generation unit, the magnetic detection element, the adhesion unit and the biasing member corresponding to each of the plurality key tops; and
    the biasing force of the biasing member that corresponds to each of the plurality of key tops differs in accordance with the position of the key top.

13. The key input apparatus according to claim 10, wherein the first substrate is a biasing member that biases the key top in a direction away from the second substrate.

14. The key input apparatus according to claim 1, wherein the magnetic detection element is a Giant Magnetoresistance (GMR) element or a Tunnel Magnetoresistance (TMR) element.

* * * * *